United States Patent
Sakuma et al.

[11] Patent Number: 5,764,697
[45] Date of Patent: *Jun. 9, 1998

[54] TRANSMITTER FOR A RADIO CONTROL DEVICE

[75] Inventors: Susumu Sakuma; Satoshi Inokoshi; Akira Aneha; Masahiro Arai; Masashi Tokita, all of Mobara, Japan

[73] Assignee: Futaba Denshi Kogyo, K.K., Mobara, Japan

[*] Notice: The term of this patent shall not extend beyond the expiration date of Pat. No. 5,608,758.

[21] Appl. No.: 633,113

[22] Filed: Apr. 16, 1996

Related U.S. Application Data

[63] Continuation of Ser. No. 91,267, Jul. 15, 1993, Pat. No. 5,608,758.

[30] Foreign Application Priority Data

Jul. 15, 1992 [JP] Japan ............... 4-049690
Jul. 15, 1992 [JP] Japan ............... 4-049691
Sep. 25, 1992 [JP] Japan ............... 4-066946

[51] Int. Cl.$^6$ .............. H03K 7/04; G08C 19/00
[52] U.S. Cl. .............. 375/239; 375/295; 375/371; 332/112; 455/92; 455/126; 370/213; 340/825.69; 340/825.72
[58] Field of Search .............. 375/239, 279, 375/219, 377, 302, 238, 295, 306, 309, 354, 371; 327/1, 3, 7, 8, 31, 36, 37, 39, 44, 45, 46, 156, 26; 332/112, 113, 119, 127, 128, 139; 370/8, 9, 10; 455/39, 76–77, 93, 62, 115, 125, 86, 87, 95, 89, 102, 110, 126, 91, 92; 340/825.69, 825.72

[56] References Cited

U.S. PATENT DOCUMENTS 4,870,699  9/1989  Garner et al. .............. 455/76

*Primary Examiner*—Chi H. Pham
*Assistant Examiner*—William Luther
*Attorney, Agent, or Firm*—Oblon, Spivak, McClelland, Maier & Neustadt, P.C.

[57] ABSTRACT

A radio control device includes a transmitter, in which a crystal type high frequency module equipped with a high frequency circuit corresponding to a frequency band of a carrier and a PLL high frequency module equipped with the high frequency circuit and a PLL circuit for controlling a frequency of the carrier depending on a phase difference between the carrier and a reference signal of oscillator are detachably mounted. Such construction permits the crystal type high frequency module and PLL high frequency module to be selectively used as desired and transmission data to be output by means of the carrier of a desired frequency set depending on the high frequency module. Also, the radio control device includes a receiver which employs a frequency synthesizer system in which a PLL, circuit for controlling an oscillation frequency depending on a phase difference between a reference signal and the oscillation frequency is used and includes a frequency selecting means for selecting a required frequency from a plurality of predetermined frequency data and a frequency setting means for fixedly setting a receive frequency on the frequency selected by the frequency selecting means when a power supply is turned on.

3 Claims, 9 Drawing Sheets

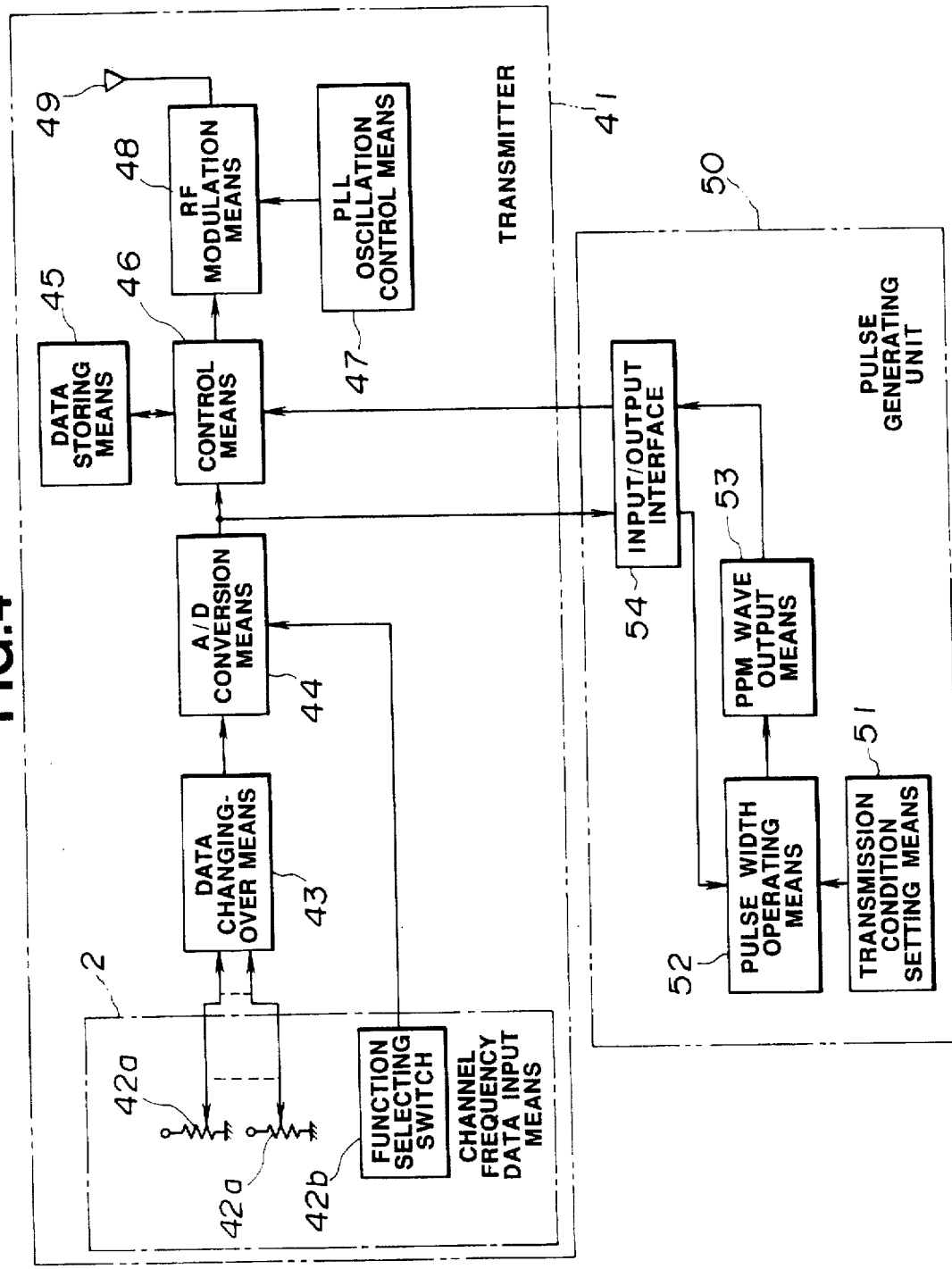

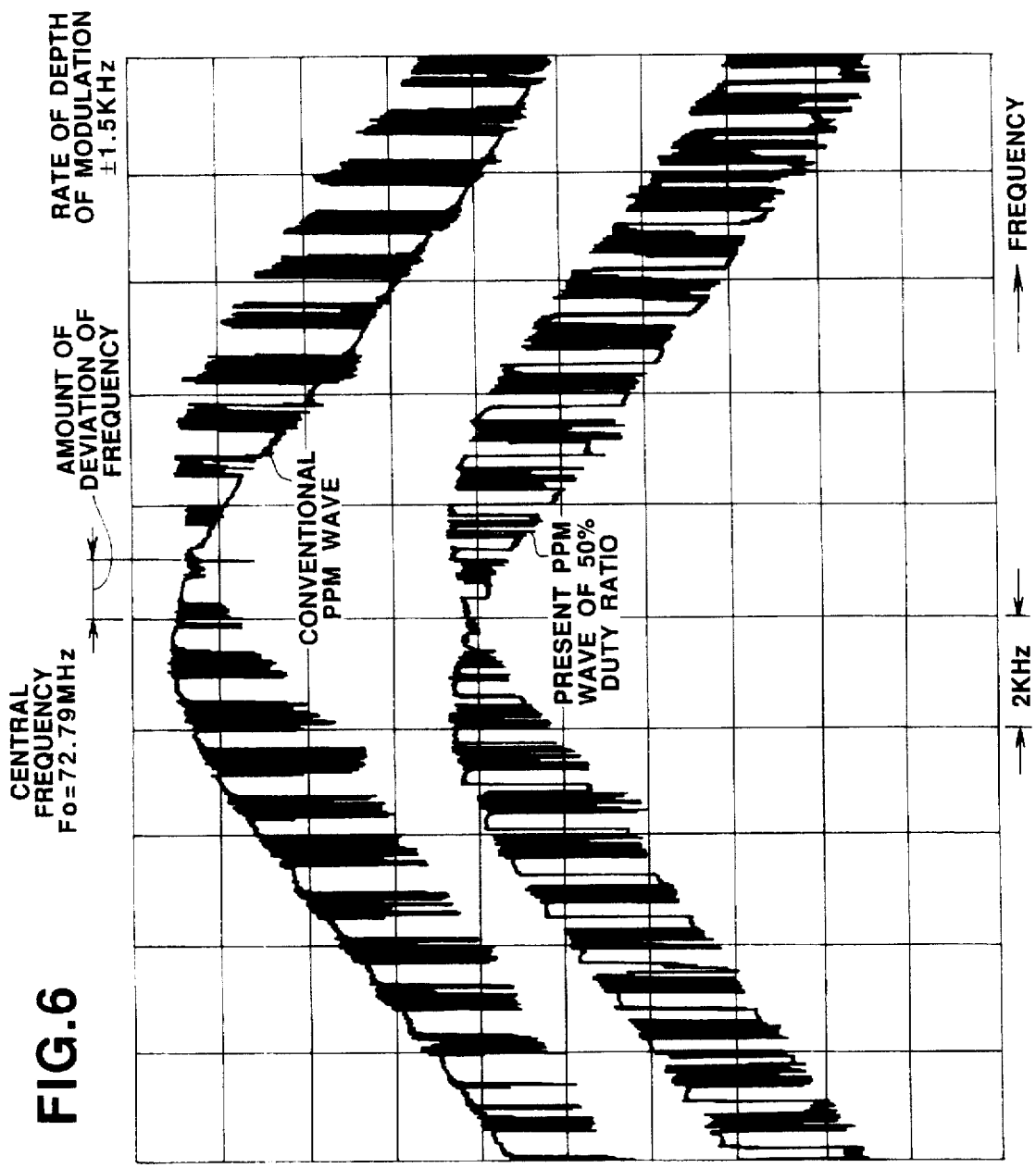

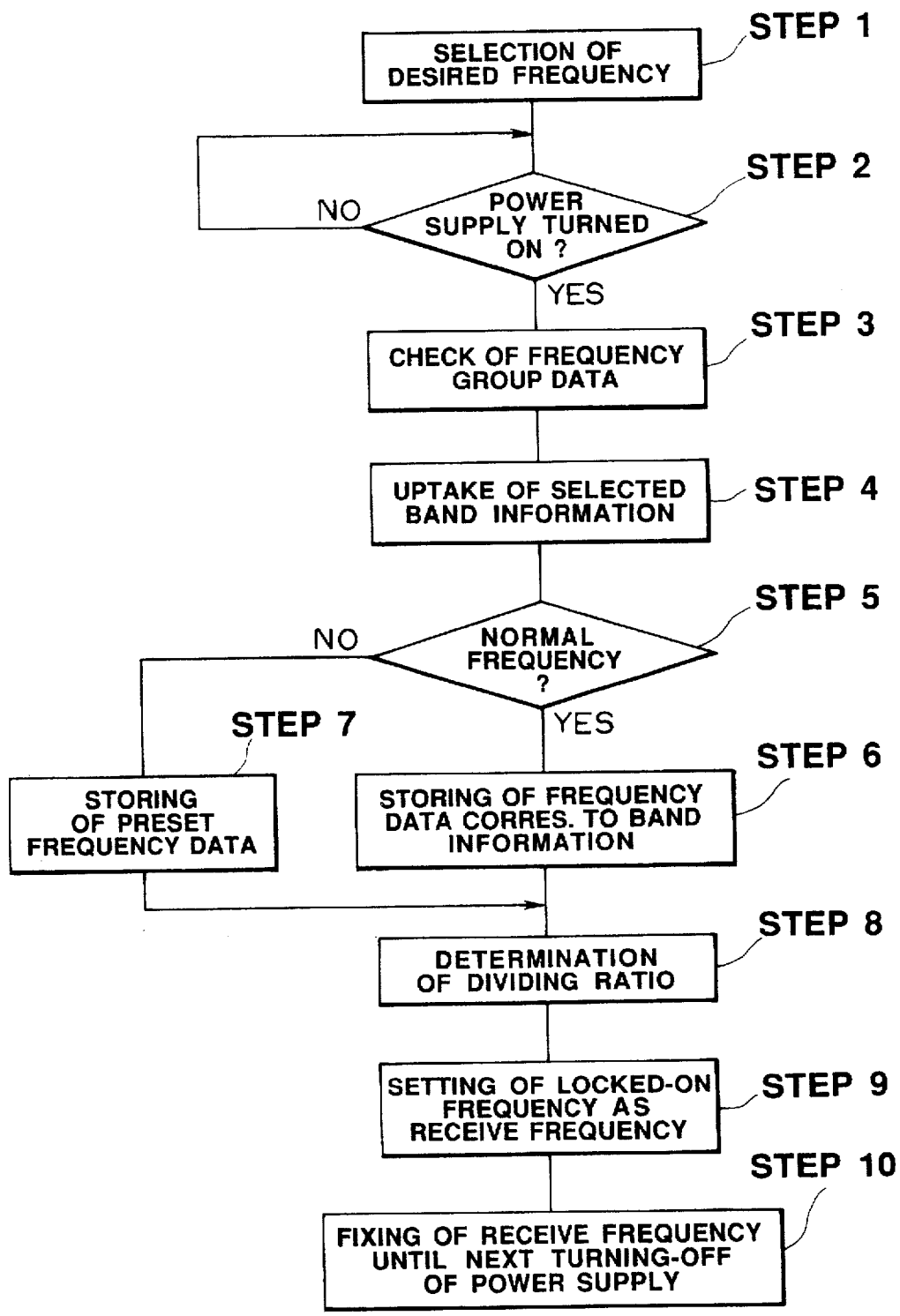

TRANSMITTER FOR A RADIO CONTROL DEVICE

This is a Continuation of application Ser. No. 08/091,267 filed on Jul. 15, 1993 now U.S. Pat. No. 5,608,758.

BACKGROUND OF THE INVENTION

This invention relates to a radio control device for remotely controlling a controlled unit or a radio control model mounted with a receiver such as, for example, a model airplane, a model vehicle, a model ship or the like by radio transmission from a transmitter, and more particularly to a radio control device for carrying out remote control of a radio control model by radio transmission, a transmitter constituting a transmission section of the radio control device, a high frequency module and a pulse generating unit each incorporated in the transmitter, and a receiver mounted on the radio control model and constituting a receiving section of the radio control device.

In general, in a radio control device for carrying out remote control of a radio control model, an amplitude modulation system (hereinafter referred to as "AM system") and a frequency modulation system (hereinafter referred to as "FM system") are known as a modulation system for modulating a main carrier applied to remote control of the radio control model by radio transmission and receiving. Also, a pulse position modulation system (hereinafter referred to as "PPM system") and a pulse code modulation system (hereinafter referred to as "PCM system") are known as a signal modulation system for modulating the main carrier.

Each country defines by law signal carrier for control by remote radio transmission and receiving. The law causes the radio control device to be subject to regulation on a usable frequency band. For example, Japan regulates that bands of 27 MHz and 40 MHz are usable frequency bands for remote control. Further, a predetermined number of frequencies are allowed in each of the usable frequency bands.

More particularly, in the case of the 27 MHz band, twelve band sections are defined at every 50 KHz interval in an area between 26.995 MHz and 27.245 MHz as shown in Table 1. In Table 1, A band section No. 12 uses 27.245 MHz and 27.255 MHz.

TABLE 1

| 27 MHz Band | |
|---|---|
| Band Section No. | Frequency (MHz) |
| 1 | 26.975 |
| 2 | 26.995 |
| 3 | 27.025 |
| 4 | 27.045 |
| 5 | 27.075 |
| 6 | 27.095 |
| 7 | 27.125 |
| 8 | 27.145 |
| 9 | 27.175 |
| 10 | 27.195 |
| 11 | 27.225 |
| 12 | 27.245 |
|  | 27.255 |

Likewise, in the case of the 40 MHz band, thirteen band sections are defined at every 20 KHz interval in an area between 40.61 MHz and 40.85 MHz as shown in Table 2.

TABLE 2

| 40 MHz Band | |
|---|---|
| Band Section No. | Frequency (MHz) |
| 61 | 40.61 |
| 63 | 40.63 |
| 65 | 40.65 |
| 67 | 40.67 |
| 69 | 40.69 |
| 71 | 40.71 |
| 73 | 40.73 |
| 75 | 40.75 |
| 77 | 40.77 |
| 79 | 40.79 |
| 81 | 40.81 |
| 83 | 40.83 |
| 85 | 40.85 |

According to a law provided in the United States of America, a band of 72 MHz is divided into fifty band sections at every 20 KHz interval in an area between 72.01 MHz and 72.99 MHz. Germany provides a similar regulation on a usable frequency band.

In view of the above, the conventional radio control device is so constructed that a so-called high frequency module which is a circuit component formed by modularizing a high frequency circuit for determining a frequency band of a carrier and/or its kind can be readily incorporated in a rear side portion of a transmitter body. Thus, accommodation to a change in frequency band of a carrier is carried out by preparing a high frequency module depending on a frequency band allowed by each country and exchanging a crystal oscillator of a predetermined oscillating frequency called a crystal.

Also, in the conventional radio control device, much effort is directed to development of a frequency synthesizer system which utilizes a phase-locked loop (hereinafter referred to as "PLL circuit") circuit as the means for changing a frequency of a signal carrier.

The frequency synthesizer system utilizing the PLL circuit is adapted to set a variety of frequencies by changing a dividing ratio of an oscillating frequency. Unfortunately, use of the frequency synthesizer is restricted by the law of each of the countries.

For example, in Japan, self-imposed control regulations on a carrier frequency in a band of 40 MHz were established by "Standard of Certification and Qualification of Conformance to Recommended Standard of Transmitter for Radio Control (Notification No. 895 of the Ministry of Posts and Telecommunications dated Nov. 24, 1984)", so that a transmitter for a radio control device is required to meet the regulations. The regulations provide that "an oscillating system must be a crystal type transmission system", therefore, it is impossible to employ the frequency synthesizer system.

Likewise, in each of countries which lack provisions on such a transmission system, any frequency other than that allowed by the country cannot be used even if it allows the use of the frequency synthesizer system.

As will be noted from the above, the countries are different in laws such as regulations on a usable frequency band and a transmission system from each other. In view of such a difference, it would be considered that the transmitter is constructed so as to be accommodated to a frequency band allowed by each of the countries. However, this requires to prepare a number of transmitters depending on the countries, because applicability of the frequency synthesizer system is varied depending on the countries as described above. Also, even if a certain country allows use of the frequency synthesizer system, it is required to construct the transmitter so that a frequency other than that in a frequency band allowed by the country may not be used.

Further, in the transmitter for the radio control device, as described above, the system for modulating a main carrier for remotely controlling a radio control model includes the AM system and FM system. Also, the system for converting a signal for modulating the main carrier includes the PPM system and PCM system. In this instance, a pulse position modulating signal (hereinafter referred to as "PPM wave") used for the transmitter is processed by arranging one-shot pulses of a predetermined width (for example, 450 μsec) in a serial manner and varying a position of each of the pulses, to thereby change a width of an output pulse of a transmission channel, resulting in an output of a receiver being controlled.

It is often desired that the radio control device concurrently carries out radio control of a plurality of controlled units in the same region. In this case, when frequencies for driving the controlled units are the same, there is a possibility that radio interference occurs between the controlled units, so that it is required to change the frequencies. Such a change in frequency is conventionally carried out by exchanging crystal oscillators so as to permit usable bands to differ from each other.

However, the change in frequency by exchange of the crystal oscillator causes an operator to always carry crystal oscillators different in frequency in order to avoid radio interference with another operator. In order to eliminate such a disadvantage, an effort is directed to development of a transmitter which is so constructed that the above-described PLL circuit which is generally used in the field of communications is incorporated therein to facilitate setting and changing of a required frequency without any exchange of circuit parts.

For example, a transmitter having such a PLL circuit incorporated therein which is manufactured according to the U.S. specifications is constructed in such a manner that when it is subject to modulation under the conditions that a time period in one frame T1, a one-shot pulse width T2, a channel pulse width T2 of each of channels near a neutral position and a central frequency FO are set to be 22.5 msec, 450 μsec, 1520 μsec, 72.79 MHz and ±1.5 KHz, respectively, and a time constant of a low pass filter in the PLL circuit is sufficiently increased, a time period of FO +1.5 KHz and that of FO −1.5 KHz are repeated by 3600 μsec and 18900 μsec at every one frame, respectively.

In other words, when the PLL circuit is thus incorporated in the transmitter, lots of time is required for modulation on a negative side of the central frequency FO, so that a loop of the PLL circuit is operated to cause an output frequency of a voltage control oscillator to approach the central frequency FO as much as possible, to thereby push up the central frequency FO rather high.

This results in causing a deviation in the central frequency FO which has been subject to PPM modulation. Also, the deviation is gradually increased with an increase in ratio of depth of the modulation with respect to the central frequency FO. Such an increase in central frequency FO leads to a region overlapping an adjacent frequency corresponding thereto in another channel, to thereby cause a possibility of radio interference, resulting in a failure in remote control of the controlled unit with high accuracy.

Further, in the radio control unit of the frequency synthesizer system in which the PLL circuit is incorporated in the transmitter, changing-over of the frequency can be relatively readily carried out, for example, by changing over a dip switch to change a dividing ratio of a divider. However, the radio control device is constructed so that a receive frequency of the receiver is automatically changed over whenever the dividing ratio of the divider is changed due to changing-over of the switch during operation of the radio control device.

Therefore, changing-over of the switch due to any action on the controlled unit causes the dividing ratio to be automatically changed to lead to changing-over of the receive frequency, to thereby cause the receive frequency of the receiver to fail to coincide with a transmission frequency of the transmitter, resulting in failing in remote control of the controlled unit. The above-described action on the controlled unit includes, when the controlled unit is a model vehicle, vibration applied to a body of the vehicle due to unevenness of a road surface during traveling of the vehicle and vibration of an engine mounted on the body. Also, the action includes misoperation after the receive signal is set once.

SUMMARY OF THE INVENTION

The present invention has been made in view of the foregoing disadvantages of the prior art.

Accordingly, it is an object of the present invention to provide a radio control device which is capable of eliminating the above-described disadvantages encountered with the conventional radio control device.

It is another object of the present invention to provide a transmitter for a radio control device which is capable of commonly using a transmitter body, selectively using a conventional crystal system and a conventional frequency synthesizer system including a PLL circuit as desired by a simple operation of merely replaceably mounting a high frequency module having a high frequency circuit incorporated therein on the transmitter body, and permitting a channel frequency usable in only a country in which the radio control device is used to be readily set to carry out remote control of a controlled unit with high accuracy.

It is a further object of the present invention to provide a high frequency module for a transmitter for a radio control device which is capable of permitting a frequency in a frequency band usable in only a country in which the radio control device is used to be readily set.

It is still another object of the present invention to provide a pulse generating unit for a transmitter for a radio control device which is capable of decreasing a deviation in central frequency during PPM modulation by means of a PLL circuit in the transmitter to improve side band characteristics thereof.

It is a still further object of the present invention to provide a receiver for a radio control device which is capable of permitting a frequency selected at the time of rising of a power supply to be fixedly as a receive frequency, to thereby prevent the receive frequency thus set once from being intentionally or accidentally changed until the power supply is subsequently turned off.

In accordance with one aspect of the present invention, a radio control device is provided. The radio control device includes a transmitter in which a crystal type high frequency module equipped with a high frequency circuit corresponding to a frequency band of a carrier and a high frequency module for phase-locked loop (hereinafter referred to as "PLL high frequency module") equipped with the high frequency circuit, as well as a PLL circuit for controlling a frequency of the carrier depending on a phase difference between the carrier and a reference signal of an oscillator are detachably mounted. The transmitter is provided with a pulse generating unit including a pulse width operating means and a PLL wave output means. The pulse width operating means operates, depending on channel frequency data, each of pulse data having a one-shot pulse width of each of channels of a PPM wave for a main carrier of which an oscillation frequency is controlled depending on a phase difference between the reference signal and a dividing signal and a reset pulse width thereof. The PLL wave output means changes a duty ratio of the PPM wave to a desired value depending on the pulse data operated by the pulse width operating means and outputting it. The radio control device also includes a receiver employing a frequency synthesizer system in which a PLL circuit for controlling an oscillation frequency depending on a phase difference between the reference signal and the oscillation frequency is used. The receiver includes a frequency selecting means for selecting a required frequency from a plurality of predetermined frequency data and a frequency setting means for fixedly setting a receive frequency on the frequency selected by the frequency selecting means when a power supply is turned on. Thus, an output of the receiver is controlled by a transmission wave formed by modulating the PLL wave output from the transmitter which has been changed to the desired duty ratio and the main carrier.

In the radio control device of the present invention constructed as described above, the crystal type high frequency module which is equipped with the high frequency circuit corresponding to the frequency band of the carrier and the PLL high frequency module which is equipped with the high frequency circuit and the PLL circuit for controlling the frequency of the carrier depending on the phase difference between the carrier and the reference signal of the oscillator are detachably mounted in the transmitter body. Such construction permits the crystal type high frequency module and PLL high frequency module to be selectively used as desired and the transmission data to be output by means of the carrier of a desired frequency set depending on the high frequency module thus selectively mounted. Also, the receiver employs the frequency synthesizer system in which the PLL circuit for controlling the oscillation frequency depending on a phase difference between the reference signal and the oscillation frequency is used and includes the frequency selecting means for selecting a required frequency from a plurality of predetermined frequency data and the frequency setting means for fixedly setting the receive frequency on the frequency selected by the frequency selecting means when the power supply is turned on, so that a required frequency may be selected by the frequency selecting means and the receive frequency is fixedly set on the frequency selected due to a variation in dividing number of a frequency demultiplier in the PLL circuit. Thus, a PPM signal can be output while being kept its duty ratio changed to a desired value, resulting in the remote control being carried out with increased accuracy.

In accordance with another aspect of the present invention, a transmitter for a radio control device is provided. The transmitter includes a transmitter body, a crystal type high frequency module equipped with a high frequency circuit corresponding to a frequency band of a carrier and detachably mounted in the transmitter body, and a PLL high frequency module equipped with the high frequency circuit, as well as a PLL circuit for controlling a frequency of the carrier depending on a phase difference between the carrier and a reference signal of an oscillator and detachably mounted in the transmitter body. The transmitter body includes a first terminal section electrically connected to the high frequency circuit of the crystal type high frequency module or PLL high frequency module when the crystal type high frequency module or PLL high frequency module is mounted in the transmitter body and a second terminal section electrically connected to the PLL circuit of the PLL high frequency module only when the PLL high frequency module is mounted in the transmitter body. Thus, transmission data are output by the carrier of a desired frequency which is set depending on data output from the high frequency module mounted in the transmitter body.

In the transmitter of the present invention constructed as described above, the crystal type high frequency module which is equipped with the high frequency circuit corresponding to the frequency band of the carrier and the PLL high frequency module which is equipped with the high frequency circuit and the PLL circuit for controlling a frequency of the carrier depending on the phase difference between the carrier and the reference signal of the oscillator are detachably mounted in the transmitter body. Also, the transmitter body includes the first terminal section electrically connected to the high frequency circuit of the crystal type high frequency module or PLL high frequency module when the crystal type high frequency module or PLL high frequency module is mounted in the transmitter body and the second terminal section electrically connected to the PLL circuit of the PLL high frequency module only when the PLL high frequency module is mounted in the transmitter body. Thus, the transmission data are output by the carrier of a desired frequency which is set depending on data output from the high frequency module mounted in the transmitter body.

In accordance with this aspect of the present invention, a transmitter for a radio control device is provided which includes a transmitter body and a PLL high frequency module comprising a high frequency circuit arranged so as to correspond to a frequency band of a carrier and a PLL circuit for controlling a frequency of the carrier depending on a phase difference between the carrier and a reference signal of an oscillator, in which the PLL high frequency module is mounted in the transmitter body to set a frequency of the carrier. The PLL high frequency module includes a frequency data storing means for storing band data indicating frequency bands which can be used for remotely controlling a controlled unit. The transmitter body includes a data storing means for storing therein a plurality of channel frequency data defined in each of the frequency bands, a data reading means for reading the band data when the high frequency module is mounted in the transmitter body, a frequency setting means for setting, from the read band data, one channel frequency data corresponding to the band data read by the data reading means, and an output means for outputting transmission data by the carrier of which a frequency has been controlled by the PLL circuit and changed depending on the channel frequency data set by the frequency setting means.

In the transmitter of the present invention constructed as described above, the PLL high frequency module includes the frequency data storing means for storing the band data indicating the frequency bands which can be used for remotely controlling a controlled unit. When the high frequency module is mounted in the transmitter body, the data reading means reads the channel frequency data of the PLL high frequency module and the frequency setting means sets one channel frequency data from the read channel frequency data, so that the output means outputs transmission data by means of the carrier of which a frequency has been controlled by the PLL circuit and changed depending on the channel frequency data set by the frequency setting means.

In accordance with this aspect of the present invention, a transmitter for a radio control device is provided which includes a transmitter body and a PLL high frequency module comprising a high frequency circuit arranged so as to correspond to a frequency band of a carrier and a PLL circuit for controlling a frequency of the carrier depending on a phase difference between the carrier and a reference signal of an oscillator, in which the PLL high frequency module is mounted in the transmitter body to set a frequency of the carrier. The PLL high frequency module includes a frequency data storing means for storing channel frequency data in frequency bands which can be used for remotely controlling a controlled unit. The transmitter body includes a data reading means for reading the channel frequency data when the high frequency module is mounted in the transmitter body, a frequency setting means for setting, from the channel frequency data read by the data reading means, one channel frequency data, and an output means for outputting transmission data by the carrier of which a frequency has been controlled by the PLL circuit and changed depending on the channel frequency data set by the frequency setting means.

In the transmitter of the present invention thus constructed, the PLL high frequency module includes the frequency data storing means for storing channel frequency data in the frequency bands which can be used for remotely controlling a controlled unit. When the high frequency module is mounted in the transmitter body, the data reading means reads the channel frequency data of the PLL high frequency module and the frequency setting means sets one channel frequency data from the read channel frequency data, so that the output means outputs transmission data by means of the carrier of which a frequency has been controlled by the PLL circuit and changed depending on the channel frequency data set by the frequency setting means.

In accordance with a further aspect of the present invention, a PLL high frequency module for a transmitter for a radio control device is provided. The PLL high frequency module includes a PLL circuit arranged in a transmitter body of the transmitter for controlling a frequency of a carrier depending on a phase difference between the carrier and a reference signal of an oscillator and a storing means for storing data for variably controlling the frequency of the carrier.

In the PLL high frequency module of the present invention thus constructed, the PLL high frequency module is detachably mounted in the transmitter body and includes the PLL circuit arranged in the transmitter body for controlling the frequency of the carrier depending on the phase difference between the carrier and the reference signal of the oscillator and the storing means for storing data for variably controlling the frequency of the carrier. Thus, the crystal type model and the module of the frequency synthesizer module can be selectively used depending on the channel frequency data set by the transmitter body.

In accordance with still another aspect of the present invention, a pulse generating unit for a transmitter for a radio control device is provided. The pulse generating unit includes a pulse width operating means for operating, depending on channel frequency data, each of pulse data having a one-shot pulse width of each of channels of a PPM wave for modulating a main carrier of which an oscillation frequency is controlled depending on a phase difference between the reference signal and a dividing signal and a reset pulse width thereof and a PLL wave output means for changing a duty ratio of the PPM wave to a desired value depending on the pulse data operated by the pulse width operating means and outputting it. Thus, the transmitter controls an output of a receiver by a transmission wave obtained by modulating the PLL wave which has been changed to the desired duty ratio and the main carrier.

The pulse generating unit of the present invention, as described above, includes the pulse width operating means for operating, depending on channel frequency data, each of pulse data having the one-shot pulse width of each of channels of the PPM wave for modulating the main carrier of which an oscillation frequency is controlled depending on the phase difference between the reference signal and the dividing signal and the reset pulse width thereof and the PLL wave output means for changing a duty ratio of the PPM wave to a desired value depending on the pulse data operated by the pulse width operating means and outputting it, so that the transmitter controls the output of the receiver by the transmission wave obtained by modulating the PLL wave which has been changed to the desired duty ratio and the main carrier. Thus, the pulse width operating means can operate the one-shot pulse width of each of channels of the PPM wave for modulating the main carrier of which an oscillation frequency is controlled depending on the phase difference between the reference signal and the dividing signal and the reset pulse width thereof and the PLL wave output means can change the duty ratio of the PPM wave to a desired value depending on the pulse data operated by the pulse width operating means and output it.

In accordance with a still further aspect of the present invention, there is provided a receiver for a radio control device of a frequency synthesizer system in which a PLL circuit for controlling an oscillation frequency depending on a phase difference between a reference signal and the oscillation frequency is used. The receiver includes a frequency selecting means for selecting a predetermined frequency from a plurality of predetermined frequency data and a frequency setting means for fixedly setting a receive frequency to a frequency selected by the frequency selecting means.

Thus, in the receiver of the present invention, the frequency selecting means selects the predetermined frequency and the frequency setting means fixedly sets the receive frequency to the frequency selected by the frequency selecting means.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIG. 4 is a block diagram showing a circuit structure of a transmitter for a radio control device according to another embodiment of the present invention and a pulse generating unit for the transmitter;

FIG. 6 is a wave form chart showing modulation waves of the transmitter shown in FIG. 4 and a conventional transmitter;

FIG. 9 is a flow chart showing an example of frequency setting operation in the receiver of FIG. 7.

DETAILED DESCRIPTION OF THE PREFERRED EMBODIMENTS

Now, a radio control device according to the present invention will be described hereinafter with reference to the accompanying drawings.

Referring first to FIGS. 1 to 3(b), a transmitter for a radio control device according to an embodiment of the present invention and a high frequency module for the transmitter are illustrated.

Figure 1:
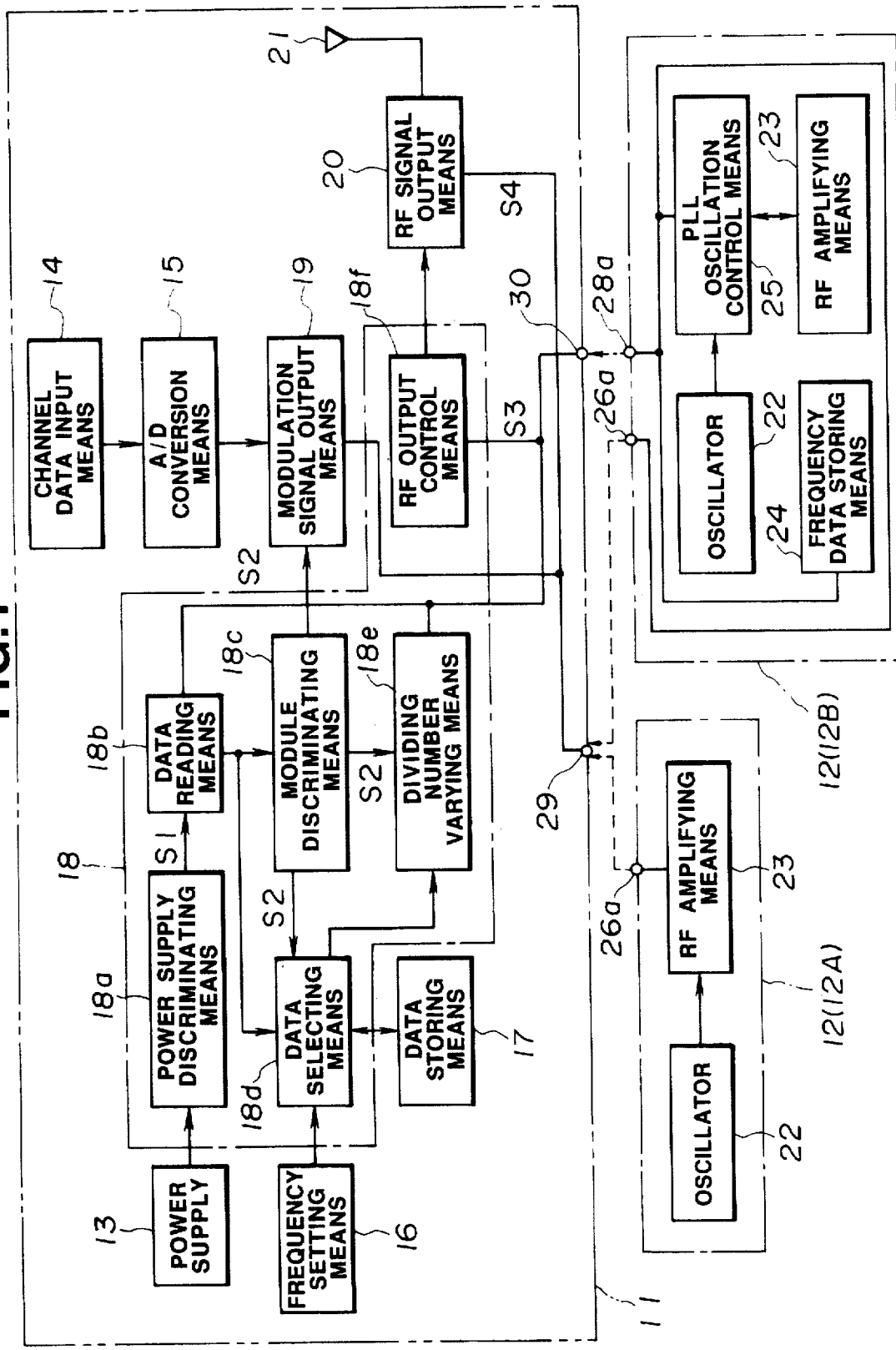
FIG. 1 is a block diagram showing a circuit structure of a transmitter for a radio control device according to an embodiment of-the present invention.
Figure 2:
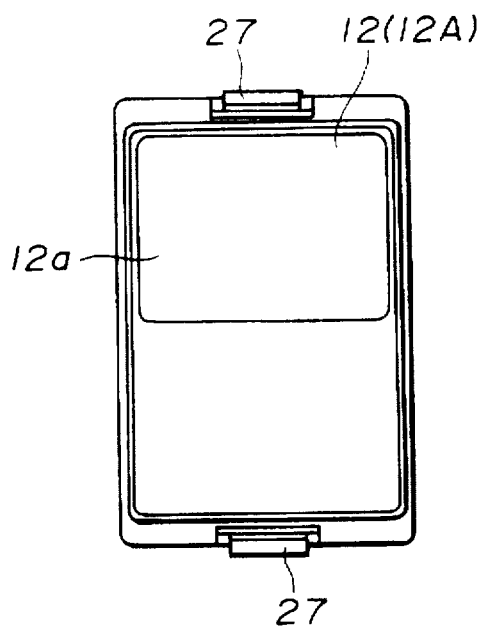
FIG. 2(a) is a front elevation view showing an example of a high frequency module of the crystal type incorporated in the transmitter shown in FIG. 1.
FIG. 2(b) is a bottom view of the high frequency module shown in FIG. 2(a)
FIG. 2(c) is a front elevation view showing a PLL high frequency module incorporated in the transmitter of FIG. 1.
FIG. 2(d) is a bottom view of the high frequency module shown in FIG. 2(c)
Figure 2:
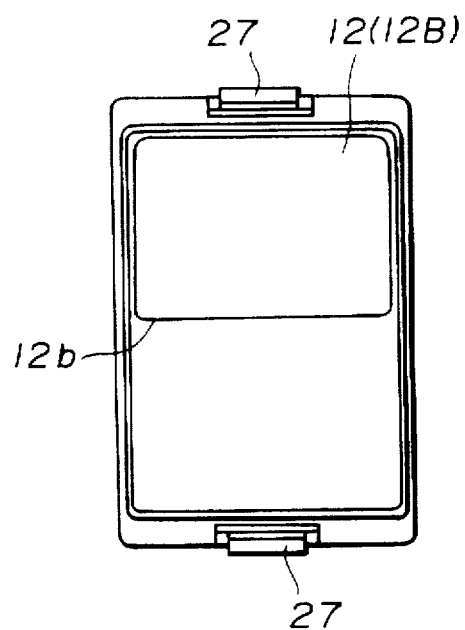
Figure 2:
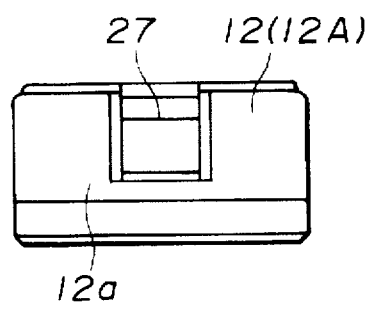
Figure 2:
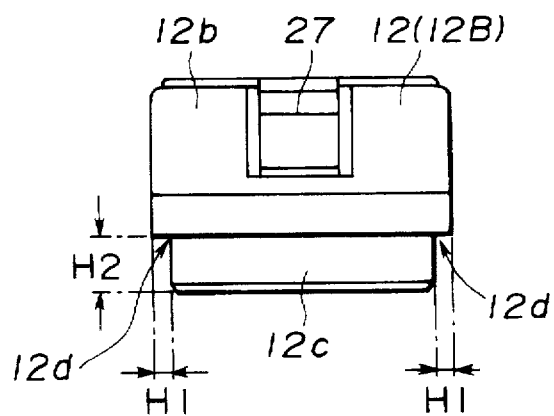

The transmitter for the radio control device of the present invention, as shown in FIG. 1, includes a transmitter body 11, which has two kinds of high frequency modules 12 or a crystal type high frequency module 12A and a PLL high frequency module 12B are detachably incorporated or mounted therein. The transmitter body 11 also includes a power supply 13, a channel data input means 14, an analog-to-digital (A/D) conversion means 15, a frequency setting means 16, a data storing means 17, a control means 18, a modulation signal output means 19, a radio frequency (RF) signal output means 20 and an output antenna 21. The control means 18 may typically comprise a central processing unit (CPU) 18.

The channel data input means 14 includes a volume provided in correspondence to each of a plurality of channels in a manner to permit an output voltage value thereof to be varied in association with a control stick (not shown) mounted on the transmitter body 11 and control function selecting switches provided in correspondence to the channels so as to actuate controlled elements of a controlled unit. The control function selecting switches, when the controlled unit is a model airplane, include a switch for actuating a retractable landing gear, a flap actuating switch, a spoiler actuating switch and the like. The data channel input means 14 thus constructed is adapted to selectively feed an analog signal corresponding to the amount of variation of the volumes and an actuation signal depending on operation of the control function selecting switches to the A/D conversion means 15 while selectively changing over both signals.

The A/D conversion means 15 functions to convert the signal selectively fed thereto from the volumes of the channel data input means 14 and the control function selecting switches into channel data of a digital signal to feed the data to the modulation signal output means 19.

The frequency setting means 16 includes a plurality of keys arranged on a front side of the transmitter body 11 and functions to set, through operation of the keys, channel frequencies indicating band sections defined in a frequency band used, to thereby determine a frequency of a carrier.

The data storing means 17 is provided in a memory region of the control means 18 so as to store therein all channel frequency data indicating a plurality of band sections defined in a frequency band of each country. Also, the data storing means 17 functions to temporarily store therein frequency data which the control means 18 reads from the high frequency modules 12 at the time of rising of the power supply 13.

The control means 18 includes a power supply discriminating means 18a for discriminating conditions of the power supply 13, a data reading means 18b, a module discriminating means 18c, a data selecting means 18d, a dividing number varying means 18e, and an RF output control means 18f.

The power supply discriminating means 18a functions to discriminate ON/OFF of the power supply 13 which feeds a drive signal required for each of circuit operations, to thereby generate a data read enabling signal S1 for permitting the data reading means 18b to read data during a period of time for which the power supply 13 is kept turned on.

The data reading means 18b reads the frequency data of the high frequency module 12 based on or depending on the data read enabling signal S1 fed thereto from the power supply discriminating means 18a.

The module discriminating means 18c discriminates a type of the high frequency module 12 currently incorporated in the transmitter body 11 depending on the frequency data of the high frequency module 12 which the data reading means 18b read at the time of rising of the power supply 13. More particularly, when the data reading means 18b fails to read the frequency data, the module discriminating means 18c judges that the high frequency module 12 is a crystal type high frequency module 12A; whereas when the former reads the frequency data, the latter judges that the high frequency module 12 is a PLL high frequency module 12B, to thereby feed a discrimination signal S2 to the data selecting means 18d, dividing number varying means 18e and the modulation signal output means 19.

The data selecting means 18d selects one channel frequency data corresponding to the frequency data of the high frequency module from the channel frequency data stored in the data storing means 17 and then feeds the channel frequency data selected to the dividing number varying means 18e, when the discrimination signal S2 which indicates that the PLL high frequency module 12B is incorporated in the transmitter body 11 is fed from the module discriminating means 18c to the transmitter body 11.

The dividing number varying means 18e feeds, to the PLL high frequency module 12B, dividing number data corresponding to the frequency of the channel frequency data output from the data selecting means 18d, when the discrimination signal S2 indicating that the PLL high frequency module 12B is incorporated in the transmitter body 11 is fed thereto from the module discriminating means 18c.

The RF output control means 18f controls the RF signal output means 20 depending on a lock-in signal fed thereto from the PLL high frequency module 12B at the time of locking-on while the PLL high frequency module 12B is kept incorporated in the transmitter body 11. Alternatively, the RF signal output means 20 may be controlled at the time of unlocking.

The modulation signal output means 19 receives the discrimination signal S2 from the module discriminating means 18c to generate a modulation signal depending on channel data converted into a digital signal.

The RF signal output means 20 transmits a high frequency signal S4 fed thereto from the high frequency module 12 in the form of transmission data from an antenna 21 depending on a control signal output from the RF output control means 18f.

The crystal type high frequency module 12A and PLL high frequency module 12B are selectively detachably incorporated through a connection structure described below in the transmission body 11 depending on a channel frequency set by the frequency setting means 16 of the transmitter body 11.

The crystal type high frequency module 12A includes an oscillator 22 and an RF amplifying means 23, resulting in forming a high frequency circuit.

The oscillator 22 includes an oscillating vibrator (not shown) of a predetermined oscillating frequency and feeds an oscillation signal output from the oscillating vibrator to the RF amplifying means 23.

The RF amplifying means 23 superimposes the modulation signal output from the modulation signal output means 19 of the transmitter body 11 on a carrier of an oscillation frequency determined by the oscillator 22 and feeds the high frequency signal S4 thus modulated to the RF signal output means 20 of the transmitter body 11.

The PLL high frequency module 12B includes a frequency data storing means 24 and a PLL oscillation control means 25 forming a PLL circuit in addition to the oscillator 22 and RF amplifying means 23 which likewise cooperate with each other to form the high frequency circuit.

The frequency data storing means 24 may comprise, for example, an electrically erasable/programmable read only memory (EEPROM) which is constructed so as to permit data to be electrically erasable or the like. In the frequency data storing means 24 may be stored band data indicating a frequency band of each country which is allowed to be used for remote control of a controlled unit or all channel frequency data indicating a plurality of band sections defined in the frequency band of each country. For example, in the United States of America, the band data relate to a band of 72 MHz and the channel frequency data relate to fifty band sections defined in an area between 72.01 MHz and 72.99 MHz in the 72 MHz band.

The PLL oscillation control means 25 includes a frequency demultiplier, a phase comparator, a low-pass filter of an A/D and D/A converter, a voltage control oscillator and the like, which are not shown in the drawings. The PLL oscillation control means 25 controls an oscillation frequency of the voltage control oscillator depending on a phase difference between the oscillation signal of the oscillator 22 and an output signal of the voltage control oscillator divided by the frequency demultiplier, wherein a dividing ratio is variably set by the dividing number data fed from the dividing number varying means 18e of the transmitter body 11 and the carrier of the oscillation frequency locked on depending on the dividing ratio thus set is fed to the RF amplifying means 23.

The RF amplifying means 23 superimposes the modulation signal from the modulation signal output means 19 of the transmitter body 11 on the carrier from the PLL oscillation control means 25 to carry out high frequency amplification and feeds the high frequency signal S4 thus modulated to the RF signal output means 20 of the transmitter body 11.

Now, connection between the transmitter body 11 and the high frequency modules 12 will be described hereinafter with reference to FIGS. 2(a) to 3(b).

Figure 3A:
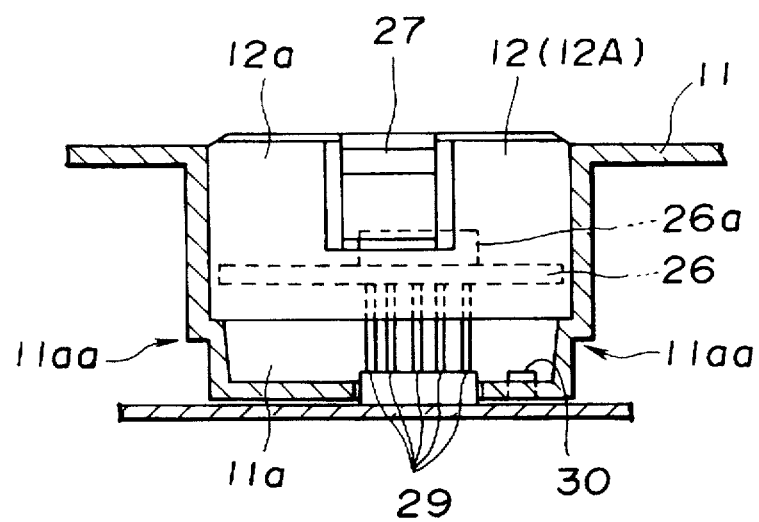
FIG. 3(a) is a sectional view showing connection between a body of the transmitter shown in FIG. 1 and the crystal type frequency module shown in FIG. 2(a)

The crystal type high frequency module 12A, as shown in FIGS. 2(a), 2(b) and 3(a), includes a module body 12a formed into a rectangular parallelopiped shape and a board 26 for a high frequency circuit arranged in the module body 12a. The high frequency circuit board 26 is mounted thereon with circuit parts such as the oscillator, RF amplifying means and the like which are electrically connected together, to thereby form a high frequency circuit. The module body 12a is provided on a central portion of each of upper and lower walls thereof with a detachable pick-up element 27 constructed into a leaf spring structure.

Figure 3B:
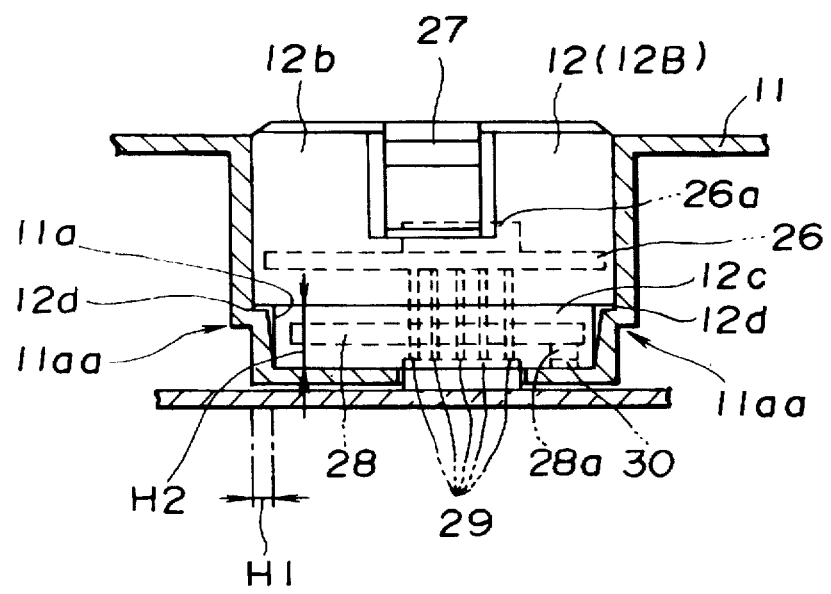
FIG. 3(b) is a sectional view showing connection between a body of the transmitter shown in FIG. 1 and the PLL high frequency module shown in FIG. 2(c)

The PLL high frequency module 12B, as shown in FIGS. 2(c), 2(d) and 3(b), includes module body 12b formed into substantially the same configuration as the module body 12a of the crystal type high frequency module 12A. The module body 12b is formed on a rear side thereof with a projection 12c of a predetermined dimension or thickness H2, which is arranged so as to be laterally projected from inwardly extending shoulders 12d of a predetermined width H1 formed on both sides of a rear wall of the module body 12b. The projection 12c is mounted therein with a PLL circuit board 28, which is then mounted thereon with circuit parts connected together, to thereby form a PLL circuit. The PLL circuit board 28 is electrically connected to the high frequency circuit board 26 through a connector (not shown).

The transmitter body 11, as shown in FIGS. 3(a) and 3(b), is formed on a rear side thereof with a mounting recess 11a for detachably mounting therein the high frequency modules 12 (12A and 12B). The mounting recess 11a is formed at a portion thereof positionally corresponding to each of the shoulders 12d of the PLL high frequency module 12B with an inward shoulder 11aa. Also, the mounting recess 11a is provided with a first terminal section 29 for connecting the high frequency circuit of the high frequency module 12 to the circuit parts in the transmitter body 11 and a second terminal section 30 for connecting the PLL circuit of the high frequency module 12 to the circuit parts in the transmitter body 11 in a manner to vertically extend.

The first terminal section 29 may be constituted by, for example, an RF output terminal, a GND terminal, an RF monitor terminal, a power supply terminal and a modulation signal input terminal each of which may be in the form of a pin. The second terminal section 30 may include, for example, an RF output control terminal, a data input terminal for the PLL, a clock terminal for timing of data input and a data latch terminal, as well as a terminal for introducing data from the EEPROM which is common to the PLL data input terminal and clock terminal. The terminals each may be formed of two pins constituting each system, resulting in the second terminal section being formed of eight pins.

The first terminal section 29 is formed into a length larger than the second terminal section 30. The first terminal section 29 is so constructed that when the crystal type high frequency module 12A is mounted in the transmitter body 11, the crystal type high frequency module 12A is positionally regulated by the shoulders 11aa of the mounting recess 11a, resulting in a connector 26a of the high frequency circuit board 26 being connected to only the first terminal 29 on the side of the transmitter body 11. When the transmitter body 11 is mounted therein with the PLL high frequency module 12B as shown in FIG. 3(b), the PLL high frequency module 12B is permitted to be fitted in a lowermost portion of the mounting recess 11a without being positionally regulated by the shoulders 11aa of the recess 11a, resulting in the connector 26a of the high frequency circuit board 26 and the connector 28a of the PLL circuit board 28 being connected to the first terminal section 29 and the second terminal section 30, respectively.

Now, the manner of operation of the transmitter of the illustrated embodiment constructed as described above will be described hereinafter.

First, in the transmitter body 11, the data reading means 18b carries out an operation for reading data of the high frequency module 12 at the time of rising of the power supply 13, to thereby judge whether or not it is possible to obtain data from the high frequency module 12 and more particularly judge whether the high frequency module 12 mounted in the transmitter body 11 is the crystal type high frequency module 12A or the PLL high frequency module 12B, depending on a state of connection between the first and second terminals 29 and 30 for electrical connection of the transmitter body 11 with the high frequency module 12 and the corresponding connectors 26a and 28a.

Then, when it is judged that the crystal type high frequency module 12A is incorporated in the transmitter body 11, the modulation signal based on the channel frequency data is superimposed on the carrier of the oscillation frequency of the oscillator 22, resulting in being subject to high frequency amplification, so that the modulated high frequency signal S4 is transmitted in the form of transmission data from the antenna 21 of the transmitter body 11.

When it is judged that the PLL high frequency module 12B is incorporated in the transmitter body 11, the following two operations are selectively executed depending on data stored in the frequency data storing means 24.

One of the operations is carried out when band data indicating a frequency band peculiar to each country are stored in the frequency data storing means 24 of the PLL high frequency module 12B. In this case, the data storing means 17 of the transmitter body 11 has all channel frequency data in frequency bands of a plurality of countries stored therein. Under such conditions, the data reading means 18b reads band data from the frequency data storing means 24 and one settable channel frequency data corresponding to the band data thus read is set through a key operation of the frequency setting means 16.

The channel frequency data selected from the data storing means 17 by such setting causes the oscillation frequency of the PLL circuit to be varied to determine a carrier of the PLL high frequency module 12B. Then, the modulation signal based on the channel frequency data is superimposed on the carrier thus determined to amplify the carrier, so that the modulated high frequency signal S4 is transmitted in the form of transmission data from the antenna 21 of the transmitter body 11.

The other operation is executed when channel frequency data of a frequency peculiar to a specific country are stored in the frequency data storing means 24 of the PLL high frequency module 12B. In this case, the data reading means 18b reads the channel frequency data from the frequency data storing means 24 to cause the channel frequency to be stored in the data storing means 17. Subsequently, when the frequency setting means 16 is subject to key operation, resulting in one channel frequency data being set; channel frequency data corresponding thereto are selected from the data storing means 17. The channel frequency data thus selected permit the oscillation frequency of the PLL circuit to be varied to determine a carrier of the PLL high frequency module 12B. Then, the modulation signal based on the channel frequency data is superimposed on the carrier thus determined to amplify it, so that the modulated high frequency signal S4 is transmitted in the form of transmission data from the antenna 21 of the transmitter body 11.

Thus, in the radio control device of the illustrated embodiment, the PLL high frequency module 12B includes the data storing means 17 in which the frequency data for variably controlling the frequency of the carrier are stored. Therefore, preliminary arrangement of the PLL high frequency module 12B in which frequency data of each country are stored in the data storing means 17 permits the transmitter to be used as a transmitter of a frequency synthesizer system using a carrier of a desired frequency as in the prior art by merely selectively exchanging the high frequency modules.

The transmitter of the illustrated embodiment is so constructed that the conventional crystal type high frequency module 12A and PLL high frequency module 12B may be detachably selectively mounted in the mounting recess 11a of the transmitter body 11. Such construction permit's the transmitter body 11 to be commonly used in both a country to which a frequency synthesizer type transmitter can be applied and a country which does not allow use of the frequency synthesizer type transmitter under the provision of a law or the like. Also, the transmitter of the illustrated embodiment selectively functions as both a crystal type transmitter and a frequency synthesizer type by merely exchanging the high frequency modules.

Also, in a country to which a frequency synthesizer type transmitter can be applied, storing of required frequency data in the data storing means 17 of the PLL high frequency module 12B permits selectable frequency data to be readily restricted by selecting desired selectable channel frequency data depending on the frequency data thus stored.

Figure 5A:
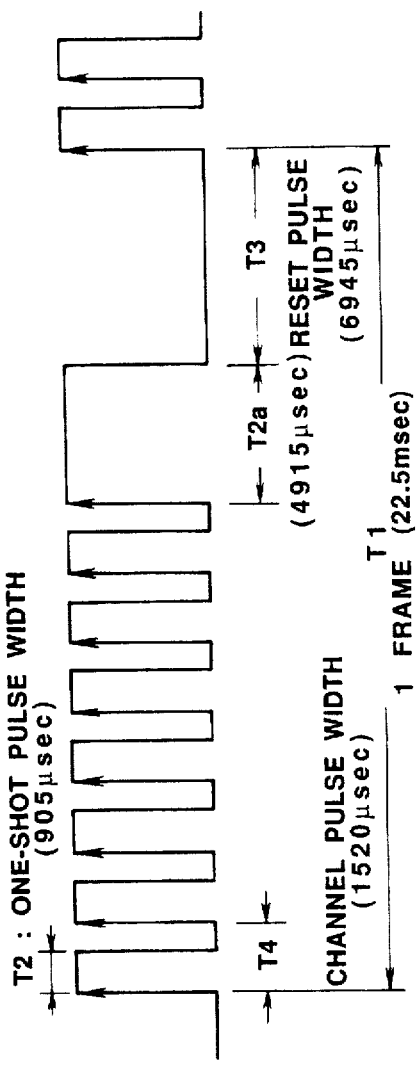
FIG. 5(a) is a wave form chart showing a PPM wave of the pulse generating device shown in FIG. 4.
Figure 5B:
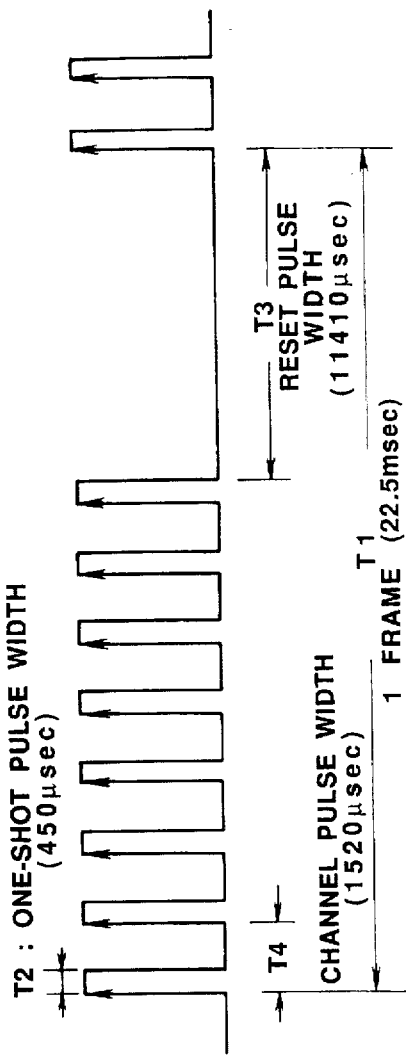
FIG. 5(b) is a wave form chart showing a PPM wave of a conventional pulse generating device.

Referring now to FIGS. 4 to 6, a transmitter for a radio control device according to another or a second embodiment of the present invention and a pulse generating unit for the transmitter are illustrated.

The transmitter generally designated at reference numeral 41 in FIG. 4 generally includes a channel frequency data input means 42, a data changing-over means 43, an A/D conversion means 44, a data storing means 45, a control means (CPU) 46, a PLL oscillation control means 47 and an RF modulation means 48.

The channel frequency data input means 42 includes a volume 42a provided in correspondence to each of a plurality of channels so as to cause an output voltage thereof to be varied in association with a stick (not shown) of the transmitter 41, resulting in feeding an analog signal depending on the amount of variation of the volume 42a to the data changing-over means 43. Also, the channel frequency data input means 42, when a controlled unit is, for example, a model airplane, includes function selecting switches 42b corresponding to the channels for actuating controlled elements of the controlled unit such as a switch for actuating a retractable landing gear, a flap actuating switch, a spoiler actuating switch and the like, resulting in feeding a signal depending on operation of the function selecting switches 42b to the A/D conversion means 44.

The data changing-over means 43 is constituted by, for example, a multiplexer and the like and is adapted to selectively change over the analog signals corresponding to the channels output from the channel frequency data input means 42.

The A/D conversion means 44 converts each of the analog signals successively fed thereto from the volumes 42a of the channel frequency data input means 42 through the data changing-over means 43 into channel frequency data which are a digital signal and feeds the data to the control means 46 and a pulse generating unit 50 described hereinafter. Also, the A/D conversion means 44 is fed with signals from the function selecting switches 42b of the channel frequency data input means 42 and likewise converts the signals into the channel frequency data which are a digital signal to feed the data to the control means 46 and the pulse generating unit 50.

The control means 46 causes data on a PPM wave of which a duty ratio is variably set at every channel depending on the amount of operation of the channel by the pulse generating unit 50 to be stored in the data storing means 45. Also, the control means 46, when the transmitter 41 is actually operated to control a controlled unit, reads, from the data storing means 45, the PPM wave data corresponding to the channel frequency data input thereto through the A/D conversion means 44 and feeds the PPM wave of a desired duty ratio to the RF modulation means 48.

The PLL oscillation control means 47 includes a reference oscillator, a frequency demultiplier, a phase comparator, a low-pass filter of an A/D and D/A converter, a voltage control oscillator and the like and is adapted to control an oscillation frequency of the voltage control oscillator depending on a phase difference between a reference signal of the reference oscillator and an output signal of the voltage control oscillator divided by the frequency demultiplier. In the PLL oscillation control means 47 thus constructed, a dividing ratio is set depending on an allowed frequency set in a high frequency module (not shown) detachably mounted on a rear side of a body of the transmitter 41. The frequency may be, for example, a frequency of selected from a plurality of band frequencies defined in each of bands.of 27 MHz and 40 MHz in Japan or in a band of 72 MHz in the United States of America. Then, a continuous main carrier of an oscillation frequency (central frequency FO) locked on depending on the dividing ratios thus set is fed to the RF modification means 48.

The RF modulation means 48 carries out frequency modulation of the continuous main carrier fed thereto from the PLL oscillation control means 47 by means of the PPM wave of a desired duty ratio read from the data storing means 45 and high frequency amplification of the continuous main carrier, which is then transmitted by an antenna 49.

The pulse generating unit 50 functions to vary a one-shot pulse width of the PPM wave used as a signal for modulating the main carrier, to increase a variable range of a reset pulse and to optionally set a duty ratio between an "H" level in one frame of the PPM wave and that of an "L" level therein. For this purpose, the pulse generating unit 50 includes a transmission condition setting means 51, a pulse width operating means 52 and a PPM wave output means 53.

The transmission condition setting means 51 functions to set various transmission conditions such as the central frequency FO of the main carrier, a rate of a depth of modulation, a time period T1 of one frame, the number of channels, a channel pulse width T4 in a neutral state of each of the channels and the like.

The pulse width operating means 52 determines a one-shot pulse width T2 and a reset pulse width T3 for each of channels depending on the transmission conditions set by the transmission condition setting means 51, so as to vary the duty ratio between of the "H" level in one frame of the PPM wave and that of the "L" level depending on channel frequency data input thereto from the transmitter 41 through an input/output interface 54.

The PPM wave output means 53 functions to vary the duty ratio of the PPM wave in one frame depending on pulse data operated by the pulse width operating means 52 to a desired value and then output it. More particularly, the duty ratio between the "H" level in one frame of the PPM wave and the "L" level during a time period T1 of one frame is varied to, for example, 50% depending on time data including the time period T1 of one frame, the number of channels, a one-shot pulse width T2 and a reset pulse width T3 and data on the PPM wave is fed through the input/output interface 54 to the control means 46 of the transmitter 41.

In this instance, when modulation is carried out while in an adjustment step, the transmitter 41 is connected to the pulse generating unit 50 in an adjustment step, the transmission condition setting means 51 of the pulse generating unit 50 sets the conditions that the central frequency FO, the rate of the modulation depth, the time period T1 in one frame, the number of channels and the channel pulse width T4 in the neutral state of each of the channels are set to be 72.79 MHz, ±1.5 KHz, 22.5 msec, eight and 1520 μsec, respectively, and a time constant of the low-pass filter is set to be a sufficiently increased value. An operation by the pulse width operating means 52, as shown in FIG. 5(a), results in the one-shot pulse width T2 at each channel between a first channel and a seventh channel and the rest pulse width T3 being 905 μsec and 6945 μsec, respectively.

In the case of PPM modulation, a position at which the signal rises is considered, so that a position of rising of the one-shot pulse of each of the channels is determined depending on the channel frequency data input. Therefore, when the duty ratio between the "H" level in one frame of the PPM wave and that of the "L" level during the time period T1 of one frame is set to be 50%, operation of the pulse width operating means 52 results in a one-shot pulse width T2a at a last or eighth channel being 4915 μsec. More particularly, a time period of a frequency at each of the "H" level and "L" level is set to be 11250 μsec and the PPM wave output means 53 generates a PPM wave having a duty ratio of 50%. Data on the PPM wave are fed to the control means 46 of the transmitter 41 and then stored in the data storing means 45.

The second embodiment is so constructed that in the transmission condition setting means 51, the time period T1 of one frame is set to be 22.5 μsec and the channel pulse width T4 is set to be within a range between, for example, 920 μsec and 2120 μsec depending on the channel frequency data (for example, the amount of operation of the volume). Also, the one-shot pulse width T2 is set to be, for example, 450 μsec or more so as to be distinguishable from noise and the reset pulse width T3 is set to be 5000 μsec or more.

Further, the pulse generating unit 50 carries out operation of the one-shot pulse width T2 and reset pulse width T3 of each of the channels so that a desired duty ratio of, for example, 50% may be obtained at any value of the channel pulse width T4 of each channel between a maximum value of the channel pulse width T4 and its minimum value.

Thus, the pulse generating unit of the illustrated embodiment is so constructed that the one-shot pulse width T2 and reset pulse width T3 of each of the channels are constantly operated depending on the channel frequency data fed thereto from the channel frequency data input means 42 while being kept connected to the transmitter 41, to thereby optionally vary the duty ratio between the frequency of the "H" level in the time period T1 of one frame and the frequency of the "L" level therein. Such construction, when the pulse generating unit is applied to the transmitter 41 while setting the duty ratio at 50%, effectively prevents radio interference due to overlapping between channel frequencies while eliminating a deviation of the central frequency FO (FIG. 6) as encountered with the prior art irrespective of any depth of modulation. Also, when the duty ratio is set to be 50%, side band characteristics of a transmission output of the PPM wave are permitted to be laterally symmetric, resulting in being improved.

Figure 7:
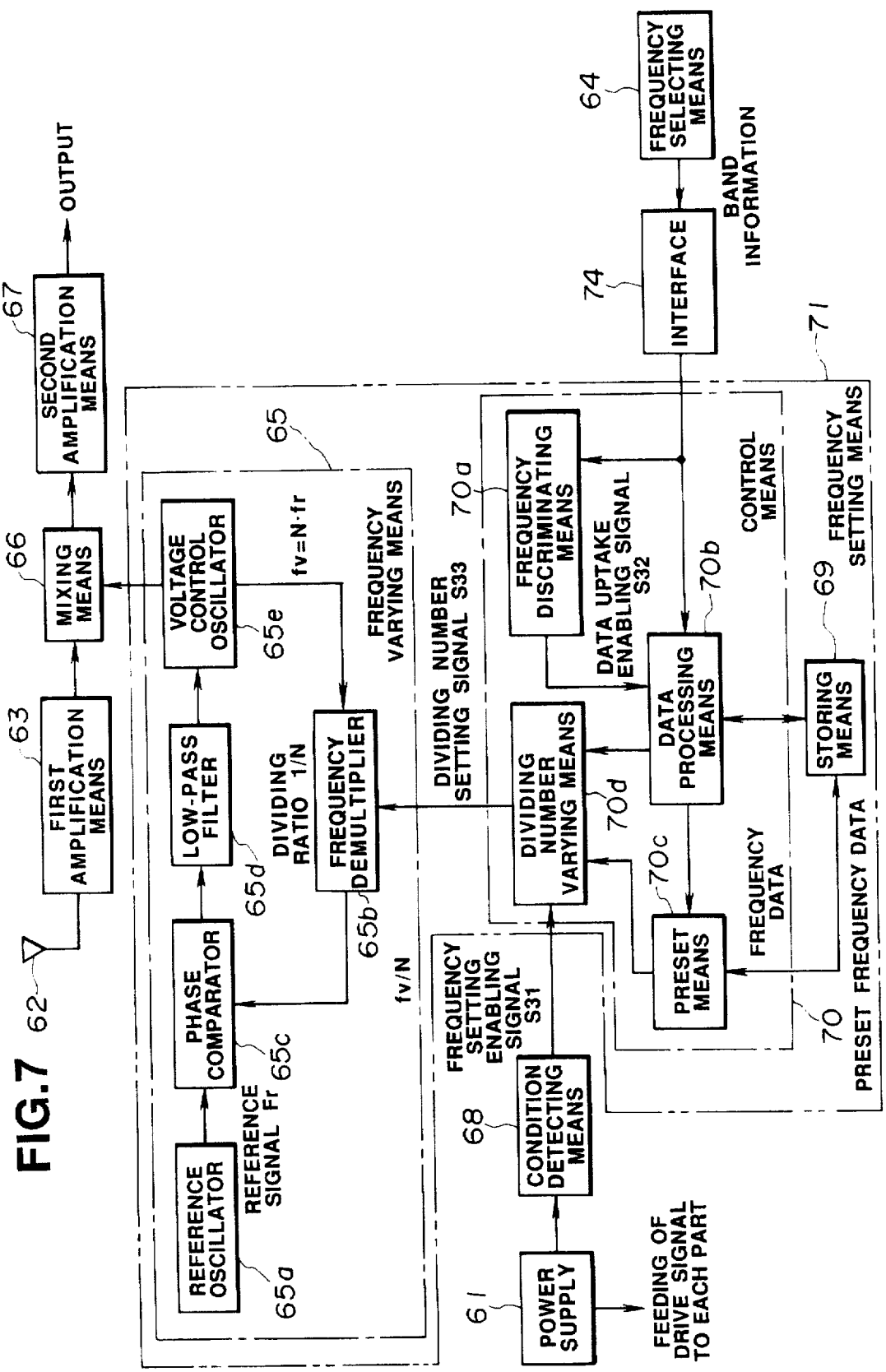
FIG. 7 is a block diagram showing a circuit structure of a receiver for a radio control device according to a further embodiment of the present invention.
Figure 8:
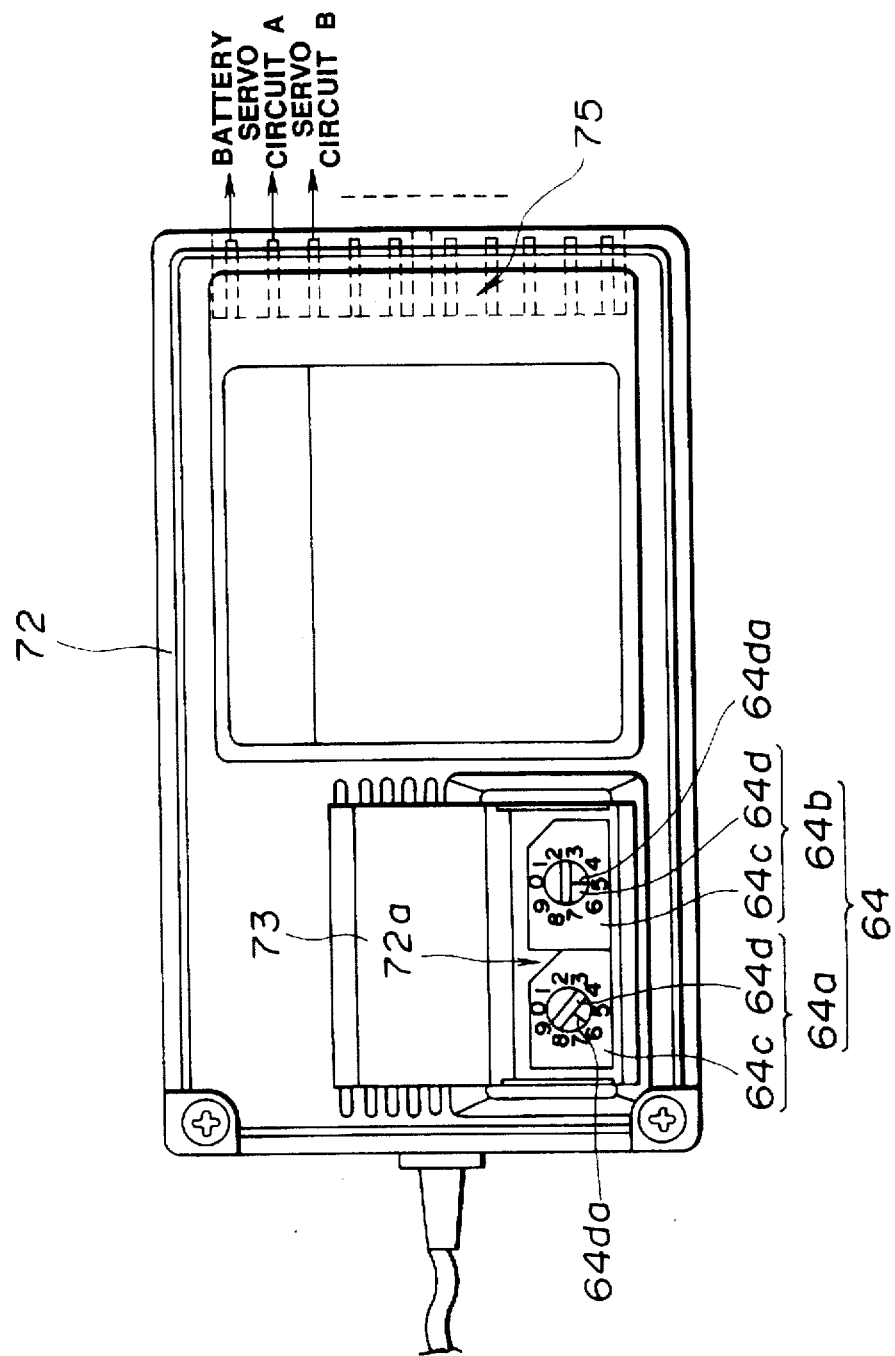
FIG. 8 is a schematic view showing an appearance of the receiver of FIG. 7.

Referring now to FIGS. 7 to 9, a receiver for a radio control device according to a further embodiment of the present invention is illustrated.

The receiver of the illustrated embodiment is adapted to be mounted on a remotely controlled unit or a radio control model such as, for example, a model airplane, a model vehicle, a model ship or the like and generally includes a power supply 61, an antenna 62, a first amplification means 63, a frequency selecting means 64, a frequency varying means 65, a mixing means 66, a second amplification means 67, a condition detecting means 68, a storing means 69, and a control means (CPU) 70. The frequency varying means 65, condition detecting means 68, storing means 69 and control means 70 cooperate with each other to constitute a frequency setting means 71.

Also, the receiver of the illustrated embodiment employs a heterodyne detection system which is adapted to mix a signal to be received and a signal fed from the frequency varying means 65 with each other, reduce a signal which was subject to frequency conversion to an intermediate frequency for amplification and then carry out detection, so that a receive frequency is determined by regarding a frequency of the frequency varying means 65 fixedly set at the time of rising of the power supply as a local oscillation frequency.

The first amplification means 63 comprises an RF amplifier and functions to subject a signal received through the antenna 62 to high frequency amplification and then feed it to the mixing means 66.

The frequency selecting means 64 may comprise, for example, two rotary type dip switches 64a and 64b, which are juxtaposed to each other in a recess 72a of a receiver body 72 covered with a lid 73 as shown in FIG. 8. Also, the dip switches 64a and 64b each are constructed so as to select band information corresponding to a desired frequency by turning an adjustment portion 64d with respect to a switch body 64c on which numerals of "0" to "9" are equally graduated. The band information selected is fed through an interface 74 to the control means 70. More particularly, selection of the frequency is carried out by adjusting the adjustment portions 64d of the switches 64a and 64b while turning them by means of a drive or the like in such a manner that a combination of graduations indicated by pointers 64da of the adjustment portions 64d coincides with the number of bands. For example, the adjustment is carried out by positioning the pointer 64da of the left-hand switch 64a at a graduation "6" and the pointer 64da of the right-hand switch 64 at a graduation "5".

The frequency varying means 65 includes a reference power supply 65a, a frequency demultiplier 65b, a phase comparator 65c, a low-pass filter of an A/D and D/A converter designated at reference numeral 65d and a voltage control oscillator 65e which constitute a PLL circuit and functions to compare a phase of an output of the voltage control oscillator 65e divided by the frequency demultiplier 65b with a phase of a reference signal, to thereby control a frequency of the voltage control oscillator 65e and its phase depending on a phase difference therebetween according to a feedback procedure. More particularly, in the frequency varying means 65, a dividing ratio 1/N of the frequency demultiplier 65b is set by a dividing number setting signal S33 output from the control means 70 described below depending on the band information of the frequency selecting means 64 at the time of turning-on of the power supply 61 and then phase comparison between an output fv/N of the voltage control oscillator 65e divided by the dividing ratio 1/N thus set and a reference signal fr from the reference oscillator 65a is carried out in the phase comparator 65c to obtain an error signal. Then, the error signal is integrated on the low-pass filter 65d, followed by being converted into an error voltage, so that a frequency fv of the voltage control oscillator 65e may be controlled by a DC voltage proportional to the error voltage, resulting in an output signal locked to the frequency fv (=N·fr) n (n: integer) times as large as the reference signal fr based on the dividing ratio 1/N of the frequency demultiplier 65b being fed to the mixing means 66.

The mixing means 66 functions to mix the above-described signal which has been subject to high frequency amplification through the first amplification means 63 with the signal from the voltage control oscillator 65e of which a frequency is fixedly set and then feed the signal thus mixed to the second amplification means 67.

The second amplification means 67 comprises an IF amplifier and functions to reduce the signal mixed in the mixing means 66 to an intermediate frequency, resulting in the signal being amplified. The signal thus amplified is subject to processing by a processing circuit (not shown) and then used for driving a servo circuit of each of the channels connected through an output connector 76 of the transmitter body 72 and controlling operation of controlled elements of a controlled unit.

The condition detecting means 68 is adapted to detect ON/OFF of the power supply 62 for feeding each of circuits with a required drive signal. For this purpose, the condition detecting means 68 functions to feed the control means 70 with a frequency setting enabling signal S31 for allowing changing-over of the dividing number of the frequency demultiplier 65b during a period of time for which the power supply 61 is kept turned on.

The control means 70 includes a frequency discriminating means 70a, a data processing means 70b, a preset means 70c and a dividing number varying means 70d.

The frequency discriminating means 70a functions to check whether or not band information fed from the frequency setting means 64 through the interface 74 to the control means 70 corresponds to frequency group data usable (for example, bands of 27 MHz and 40 MHz). When the band information corresponds to the usable frequency group data, the frequency discriminating means 70a carries out discrimination on whether or not the frequency by the band information corresponds to a normal frequency, to thereby feed a data uptake enabling signal to the data processing means 70.

The data processing means 70b receives the band information from the frequency selecting means 64 depending on the data uptake enabling signal S32. When a frequency of the band information corresponds to the normal frequency, the data processing means 70b causes frequency data of the band information to be stored in the storing means 69 while being distributed among addresses defined in the storing means so as to cause the number of a desired band section in each of bands and the number of each of the switches 64a and 64b acting as the frequency selecting means 64 to be equal to each other.

The preset means 70c, when the frequency of the band information fails to correspond to the normal frequency, causes preset frequency data indicating a maximum or minimum value of a frequency in the same band to be stored in the storing means 69.

The dividing number varying means 70d functions to output the dividing number setting signal S33 corresponding to the frequency stored in the storing means 69 by the data processing means 70b or preset means 70c, to thereby vary the dividing number of the frequency demultiplier 65b depending on the frequency setting enabling signal S31 from the condition detecting means 68. In the frequency demultiplier 65b, the dividing number setting signal S33 causes the dividing ratio 1/N to be determined and input of the frequency setting enabling signal S31 to be stopped, so that a receive frequency based on the dividing ratio 1/N is kept fixedly set until the power supply is then turned on.

Now, the manner of frequency setting operation of the receiver of the illustrated embodiment will be described hereinafter with reference to FIG. 9.

First, the switches 64a and 64b acting as the frequency selecting means 64 are operated to select a frequency desired (STEP 1). For example, when a frequency (40.65 MHz) of a band section "65" in a band of 40 MHz is to be selected, the pointer 64da of the left-hand switch 64a (FIG. 8) is set to a graduation "6" and the pointer 64da of the left-hand switch 64b is set to a graduation "5". Then, the power supply 61 of the receiver is turned on (STEP 2—Yes), the receiver checks the usable frequency group data stored (STEP 3).

Then, the band information selected by the switches 64a and 64b are introduced (STEP 4) and whether or not a frequency of the band information corresponds to the normal frequency is judged (STEP 5—Yes). When the frequency corresponds to the normal frequency (STEP 5), frequency data corresponding to the band information are stored in the storing means 69 (STEP 6). When the frequency does not correspond to the normal frequency (STEP 5—No), the preset frequency data preset at a maximum or minimum value of a frequency in a band (for example, a band of 40 MHz) in the same group are stored in the storing means 69 (STEP 7).

Then, a dividing ratio of the frequency demultiplier 65b is determined on the basis of the frequency data or preset frequency data stored in the storing means 69 (STEP 8). Subsequently, a frequency locked on at the dividing ratio is set as a receive frequency (STEP 9), which is fixed until the power supplied is turned off (STEP 10).

Thus, the receiver of the illustrated embodiment is so constructed that the receive frequency is set based on the frequency data selected by the switches 64a and 64b acting as the frequency selecting means 64 at the time of rising of the power supply and the receive frequency is fixed until the power supply is then turned off. Such construction effectively prevents the receive frequency set once from being intentionally or accidentally varied due to disturbance such as vibration, misoperation or the like, to thereby improve reliability of the receiver.

The receiver of the illustrated embodiment may be additionally provided with a timer means and constructed in such a manner that feeding of the frequency setting enabling signal S31 to the control means 70 is delayed so as to permit a change in frequency by the switches 64a and 64b of the frequency selecting means 64 to be carried out until a predetermined period of time elapses after turning-on of the power supply 61. The predetermined period of time may be as long as tens seconds.

While preferred embodiments of the invention have been described with reference to the drawings, obvious modifications and variations are possible in light of the above teachings. It is therefore to be understood that within the scope of the appended claims, the invention may be practiced otherwise.

What is claimed is:

1. A transmitter for a radio control device which includes a transmitter body and a PLL (phase-locked loop) high frequency module operating at a frequency band of a carrier and having a PLL circuit for controlling a frequency of said carrier depending on a phase difference between said carrier and a reference signal of an oscillator, in which said PLL high frequency module is mounted in said transmitter body in order to set said frequency of said carrier, wherein:

said PLL high frequency module includes a frequency data storing means for storing band data including frequency bands which can be used for remotely controlling a controlled unit; and said transmitter body includes a data storing means for storing therein a plurality of channel frequency data defined in each of said frequency bands, means for determining when said high frequency module is mounted in said transmitter body, a data reading means for reading said band data when said high frequency module is mounted in said transmitter body, a manually operated frequency setting means for selecting, from said band data which has been read, one of said plurality of channel frequency data corresponding to the band data read by said data reading means, and an output means for outputting transmission data by the carrier of which said frequency has been controlled by said PLL circuit and changed depending on the channel frequency data set by said frequency setting means.

2. A transmitter for a radio control device which includes a transmitter body and a PLL (phase-locked loop) high frequency module operating at a frequency band of a carrier and a PLL circuit for controlling a frequency of said carrier depending on a phase difference between said carrier and a reference signal of an oscillator, in which said PLL high frequency module is mounted in said transmitter body in order to set said frequency of said carrier, wherein:

said PLL high frequency module includes a frequency data storing means for storing channel frequency data in frequency bands which can be used for remotely controlling a controlled unit; and said transmitter body includes means for determining when said high frequency module is mounted in said transmitter body, a data reading means for reading said channel frequency data when said PLL high frequency module is mounted in said transmitter body, a frequency setting means for selecting, one channel frequency data from said frequency band, and an output means for outputting transmission data by the carrier of which said frequency has been controlled by said PLL circuit and changed depending on the channel frequency data set by said frequency setting means.

3. A pulse generating unit for a transmitter for a radio control device which controls an output of a receiver by transmitting a PPM wave, comprising:

a pulse width operating means for determining both pulse data having a one-shot pulse width for each channel of said PPM (pulse position modulation) wave and a reset pulse width based on a manually set channel frequency data and for modulating a main carrier of which an oscillation frequency is controlled depending on a phase difference between a reference signal and a dividing signal; and a PPM wave output means for changing a duty ratio of the PPM wave to a desired value depending on the pulse data from said pulse width operating means and outputting said PPM wave.

* * * * *